(12) United States Patent
Schriever et al.

(10) Patent No.: US 7,388,696 B2
(45) Date of Patent: Jun. 17, 2008

(54) DIFFUSER, WAVEFRONT SOURCE, WAVEFRONT SENSOR AND PROJECTION EXPOSURE APPARATUS

(75) Inventors: Martin Schriever, Aalen (DE); Helmut Haidner, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/246,633

(22) Filed: Oct. 11, 2005

(65) Prior Publication Data

US 2006/0109533 A1    May 25, 2006

Related U.S. Application Data

(63) Continuation of application No. PCT/EP03/08738, filed on Aug. 7, 2003.

(30) Foreign Application Priority Data

Apr. 11, 2003    (DE) ............................... 103 17 278

(51) Int. Cl.
    *G02B 5/32*    (2006.01)
(52) U.S. Cl. ........................... 359/15; 359/19; 359/569
(58) Field of Classification Search ................ 359/15, 359/16, 19, 599, 569
    See application file for complete search history.

(56) References Cited

U.S. PATENT DOCUMENTS

| 5,848,119 A | * | 12/1998 | Miyake et al. ................. 378/34 |
| 6,278,550 B1 | * | 8/2001 | Kathman et al. ........... 359/599 |
| 2002/0024738 A1 | | 2/2002 | Kolste et al. |
| 2002/0160545 A1 | | 10/2002 | Anderson et al. |
| 2005/0264827 A1 | | 12/2005 | Schriever et al. |

FOREIGN PATENT DOCUMENTS

| DE | 198 24 030 A1 | 2/1999 |
| DE | 101 09 929 A1 | 11/2001 |
| DE | 101 05 958 A1 | 9/2002 |
| EP | 1 118 905 A2 | 7/2001 |
| WO | WO 01/33261 A1 | 5/2001 |

* cited by examiner

*Primary Examiner*—Fayez G. Assaf
(74) *Attorney, Agent, or Firm*—Sughrue Mion, PLLC

(57) ABSTRACT

A wavefront source having a wavefront formation structure (4a) and a diffuser with a scattering structure (2b) in the beam path in front of or at the level of the wavefront formation structure; also a diffuser configured to be used therefor, and a wavefront sensor equipped therewith, as well as a corresponding projection exposure apparatus. The diffuser has a diffractive computer-generated hologram (CGH) scattering structure with a predetermined angular scattering profile. The wavefront source includes such a diffuser and/or a focusing element with a reflecting diffractive focusing structure (3a) in the beam path at the level of the scattering structure or between the scattering structure (2b) and the wavefront formation structure (4a). The disclosed structures are used, e.g., in the wavefront measurement of projection objectives in microlithography projection exposure apparatuses in the EUV wavelength range.

25 Claims, 4 Drawing Sheets

DIFFUSER, WAVEFRONT SOURCE, WAVEFRONT SENSOR AND PROJECTION EXPOSURE APPARATUS

This application is a continuation application of international patent application PCT/EP03/08738 filed on Aug. 7, 2003 and claiming priority from German patent application 103 17 278.5 filed on Apr. 11, 2003. The complete disclosures of these two patent applications are incorporated into this application by reference.

BACKGROUND OF THE INVENTION

1. Field of the Invention

The invention relates to a diffuser having a scattering structure for a wavefront source, to a corresponding wavefront source comprising, in addition to the diffuser, a wavefront formation structure in the beam path after or at the level of the scattering structure, to an associated wavefront sensor and an associated projection exposure apparatus.

2. Description of the Related Art

A wavefront source of this type is disclosed in the published patent application DE 101 09 929 A1 as part of a device for the wavefront measurement of optical systems by means of shearing interferometry, in particular of a projection objective of a microlithography projection exposure apparatus. A two-dimensional multihole mask, also referred to as a coherence mask, preferably functions as the wavefront formation structure there. The spatial structure of the wavefront source serves for shaping the spatial coherence of the wavefront. Furthermore, it is also known from this document that the wavefront formation structure may be fitted on a ground-glass screen or a ground-glass screen may be disposed upstream of it in order to control the spatial coherence, since the illumination of the wavefront formation structure should ideally be as incoherent as possible. In addition, a refractive or diffractive focusing element operating in transmission may be provided in front of the wavefront formation structure in order to adapt the illumination aperture to the aperture diaphragm of the measured projection projective. The ground-glass screen may lie in front of or behind the focusing element.

Aberrations of a microlithographic projection objective and of other high-resolution optical imaging systems can be determined very precisely by means of the interferometric wavefront measurement mentioned. The use of the wavefront source, also referred to as a wavefront module or source module, makes it possible to utilize the illumination system part of the projection exposure apparatus or of some other measured optical imaging system for this interferometric aberration determination as well. It is advantageous for the wavefront source to be configured in such a way that it can be integrated into a microlithography projection exposure apparatus in a simple manner in order to be able to check the imaging quality of the projection objective not only prior to its installation in the projection exposure apparatus but also afterward at its place of use from time to time.

In the earlier German patent application 102 17 242.0, the priority of which is claimed by the present application and the entire scope of which is hereby incorporated by reference, it is proposed, as a developing measure, to arrange the wavefront formation structure besides a useful pattern, which is to be imaged e.g. on to a wafer as intended by the projection objective, on a common substrate. This enables an aberration determination and thus also as necessary an aberration control or aberration regulation during normal exposure operation.

For the measurement of optical systems with the wavefront provided by the wavefront source, as is known, in addition to the abovementioned shearing interferometry, other interferometric methods are also possible, but also non-interferometric methods, such as the Shack-Hartmann method or Hartmann method. In the latter case, the wavefront formation structure typically comprises an individual so-called pinhole or a one- or two-dimensional arrangement of a plurality of such pinholes, that is to say openings having a very small diameter.

Especially for the field of use of microlithography, in order to obtain very fine wafer structures, the trend is toward ever shorter exposure wavelengths in the UV range below 200 nm and particularly in the EUV range. Accordingly, there is a demand for wavefront sources that are able to supply in this wavelength range a wavefront that can be used to interferometrically measure a projection objective sufficiently accurately with regard to aberrations. One difficulty in this context is that customary illumination systems such as are used in microlithography projection exposure apparatuses in order to supply the desired UV or EUV exposure radiation have a certain pupil parceling and, moreover, do not fill the entire numerical aperture of the projection objective.

Therefore, the technical problems on which the invention is based include providing a wavefront source of the type mentioned in the introduction which is able to provide the wavefront radiation across the beam cross-section of interest comparatively homogeneously and over the entire numerical aperture of the measured optical system with comparatively high effectiveness also for UV and in particular EUV systems, and also providing a diffuser that can be used for such a wavefront source, providing a wavefront sensor equipped with such a wavefront source, and providing a projection exposure apparatus containing such a sensor.

SUMMARY OF THE INVENTION

According to a first aspect, a diffuser for a wavefront source of a wavefront sensor is provided, having a scattering structure in the form of a diffractive CGH (computer-generated hologram) scattering structure with a predetermined angular scattering profile. Such diffractive scattering structures can be calculated by means of algorithms known per se for this purpose, such as are customary for computer-generated holograms (CGH) (therefore the designation "CGH structure"), and typically cannot be described by analytical functions. Depending on the requirement, the scattering structure may be realized in transmitting or reflecting fashion.

In one advantageous refinement, the diffractive CGH scattering structure is designed for a two-dimensional, essentially Gaussian angular scattering profile.

The scattering structure may advantageously be formed by a transmitting, reflecting or absorbing multilayer structure, e.g. with a base layer and at least one overlying structure layer in accordance with the calculated CGH pattern so that the multilayer structure has at least two defined step heights. A light path variation in accordance with the calculated CGH pattern is effected with the structuring. The dimensions of the structures result from the wavelength and the materials used and the required scattering range. For the preferred multilayer structure for use with EUV, resulting favorable structure sizes are 30 nm to 3000 nm perpendicular to the light direction and 3 nm to 200 nm in the light direction.

In a further refinement of the invention, means for movably supporting the diffractive CGH scattering structure are provided, which means enable said structure to be moved, depending on the requirement, in one or more spatial directions, that is to say with respect to one or more of the six degrees of freedom of movement, preferably during a measuring operation.

In a second aspect, a wavefront source for a wavefront sensor in particular for the wavefront measurement of optical systems is provided, which wavefront source comprises a wavefront formation structure and a diffuser according to the invention in the beam path in front of or at the level of the wavefront formation structure.

It is found that such a diffractive CGH scattering structure, precisely also for the UV and especially EUV wavelength range, firstly can be dimensioned well and secondly can be realized with materials suitable for this wavelength range, and has a sufficient scattering capability.

In one refinement of this wavefront source, a focusing element is situated in the beam path in front of the wavefront formation structure. The diffractive CGH scattering structure may be situated in front of or behind the focusing element or at the level thereof. The focusing element may be an arbitrary conventional, refractive or diffractive focusing element operating in transmission or reflection.

In a third aspect, a wavefront source for a wavefront sensor is provided, which wavefront source comprises a wavefront formation structure and a diffuser with a scattering structure in the beam path in front of the wavefront formation structure, and a focusing element with a reflecting diffractive focusing structure in the beam path at the level of the scattering structure of the diffuser or between said structure and the wavefront formation structure. In this case, depending on the requirement, the diffuser may be a diffuser according to the invention or a conventional diffuser.

Both of the measures mentioned, that is to say the special diffuser and the reflecting diffractive focusing structure, contribute individually and in combination to the fact that the wavefront source can provide a wavefront with comparatively homogeneous and complete illumination of the field or the pupil of the optical system to be measured interferometrically, precisely also in the UV and in particular EUV wavelength range.

In one advantageous refinement of the wavefront source, the scattering structure of the diffuser according to the invention or conventional diffuser and the wavefront formation structure are formed next to one another on a common substrate. This measure can preferably be combined with the use of a reflecting focusing element.

In further aspects of the invention, a wavefront source according to the invention can advantageously be used for a wavefront sensor which enables highly accurate measurement of objectives for use in projection exposure apparatuses with regard to imaging errors. The wavefront sensor may be realized as an independent measuring device, but it may also be integrated into a projection exposure apparatus. In the case of such projection exposure apparatuses according to the invention, the wavefront source of the wavefront sensor may be e.g. a fixed constituent part of a reticle displacement unit or arranged on a carrier which can be loaded instead of a mask reticle into the reticle plane of the projection exposure apparatus.

BRIEF DESCRIPTION OF THE DRAWINGS

Advantageous exemplary embodiments of the invention are illustrated in the drawings and are described below. In this case.

DETAILED DESCRIPTION OF PREFERRED EMBODIMENTS

Figure 1:
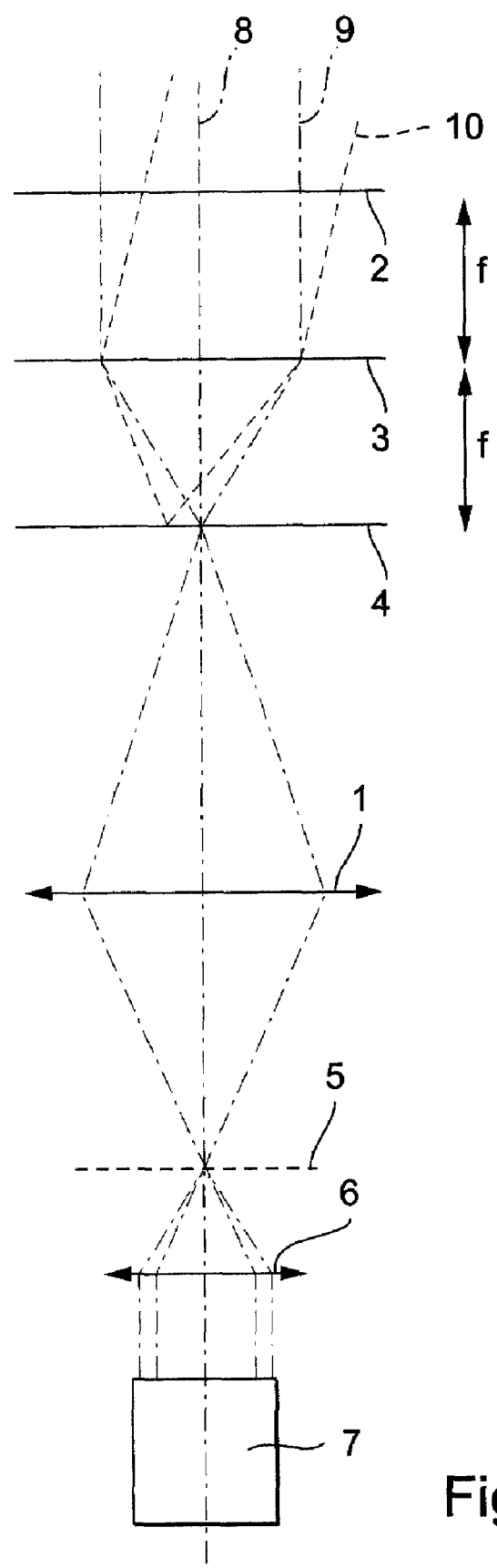
FIG. 1 shows a schematic side view of a device for wavefront measurement of an optical imaging system.

FIG. 1 schematically shows a device for interferometric wavefront measurement of an optical system 1, which, in particular, is a projection objective of a microlithography projection exposure apparatus. In this case, the device may be integrated into the projection exposure apparatus as a so-called operating interferometer in order to check the imaging quality of the projection objective 1 at its place of use from time to time, the measurement device preferably using the same radiation that is used by the apparatus in normal exposure operation and is supplied by an upstream illumination system (not shown in FIG. 1) customary for this purpose. Preferably UV radiation and especially EUV radiation may be involved in this case.

A wavefront source is arranged between the illumination system (not shown) and the projection objective 1 to be measured, said wavefront source serving for shaping radiation that comes from the illumination system into a wavefront radiation that is suitable for interferometric wavefront measurement of the objective 1. For this purpose, the wavefront source has, one behind the other in the beam path, a transmitting diffuser 2, a transmitting focusing element 3 and a transmitting coherence mask 4 or wavefront formation structure. The diffuser 2 and the coherence mask 4 are in each case situated approximately at the focal length distance f in front of and behind the focusing element 3, that is to say that the wavefront source effects a so-called 2f imaging with this arrangement. In this case, a distance of only approximately, but not exactly, f is preferred for the diffuser 2.

The coherence mask 4 is situated, as usual, preferably in the region of the object plane of the objective 1. The image-side system part shown is likewise of a conventional type and, in this example, comprises a diffraction grating 5 preferably arranged in the region of the image plane of the objective 1, a microobjective 6, preferably at focal length distance behind the diffraction grating 5, and a detector element 7, e.g. an image recording camera with a CCD array.

The associated beam course is represented schematically in FIG. 1 on the basis of a marginal ray 9 that is incident parallel to the optical system axis 8, the imaging behavior of the focusing element 3 of the wavefront source additionally being illustrated in dash-dotted fashion by the course of an obliquely incident marginal ray 10, which is focused onto the coherence mask 4 onto a point offset with respect to the optical system axis 8. The mask 4 is provided with a wavefront formation structure of a customary type which is chosen in a manner dependent on the respective application, e.g. a zero- one- or two-dimensional pinhole structure or a shearing interferometry mask structure. Whereas all three components 2, 3, 4 of the wavefront source are shown as elements operating in transmission in the example of FIG. 1, a realization operating in reflection is possible for each of these components in alternative embodiments.

Figure 2:
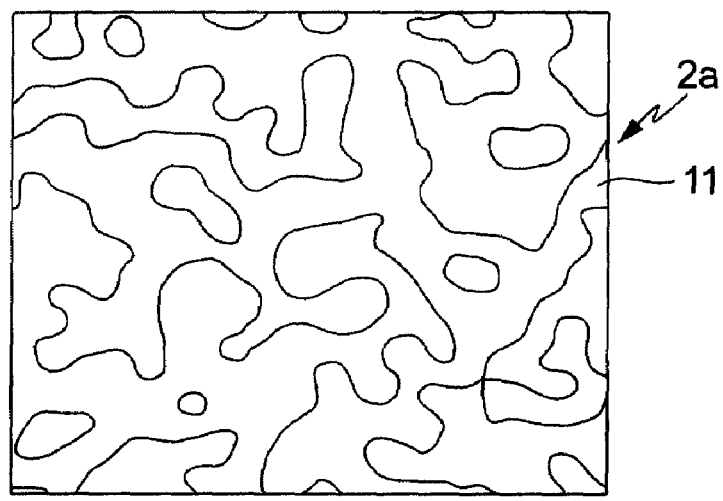
FIG. 2 shows a schematic, partial plan view of a diffractive CGH scattering structure such as can be used for a diffuser of a wavefront source of the device of FIG. 1.

FIG. 2 shows a schematic plan view of a detail from a diffuser 2a that can be used for the wavefront source of FIG. 1. The diffuser 2a has a diffractive CGH scattering structure 11, which is calculated by means of a conventional algorithm such as is typically used for calculating computer-generated holograms (CGH), and which cannot be described by analytical functions. The diffractive CGH scattering structure 11 is determined such that a predetermined angular scattering profile is obtained or optimized by means of its orders of diffraction, preferably an essentially Gaussian two-dimensional angular scattering profile, that is to say a two-dimensional Gaussian scattering angle distribution. A pure phase scattering structure, a pure amplitude scattering structure or combined amplitude and phase scattering structures may be involved in this case, depending on the requirement. The diffractive CGH scattering structure 11 illustrated in part and in a bright/dark distribution in FIG. 2 generates such a Gaussian two-dimensional scattering angle distribution as a two-stage phase and/or amplitude structure. For a scattering angle range of ±0.5° to ±5°, as is typical for microlithographic projection exposure apparatuses in the EUV range, the scattering structure 11 comprises minimum structure sizes perpendicular to the direction of light incidence of approximately 30 nm to approximately 3000 nm, preferably of approximately 100 nm to approximately 200 nm.

Figure 3:
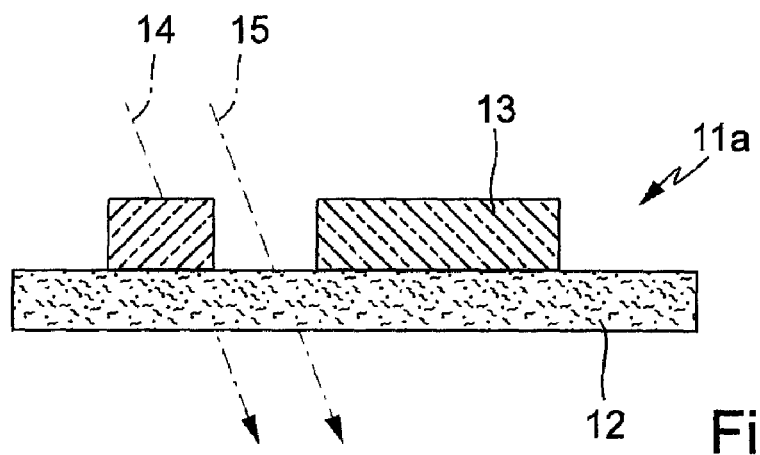
FIG. 3 shows a schematic cross-sectional view through the diffractive CGH scattering structure of FIG. 2 in a transmitting multilayer realization with a continuous base layer and an overlying CGH structure layer.

These and other diffractive CGH scattering structures can be realized both in transmission and in reflection with materials suitable for EUV. Thus, FIG. 3 shows schematically and partially a realization of the diffractive CGH scattering structure 11 of FIG. 2 in transmission as a multilayer structure 11a with a transmitting base layer 12 made e.g. of silicon or silicon nitride and a transmitting structure layer 13 applied thereto, also called a membrane layer, e.g. made of molybdenum. The membrane layer 13 is structured in accordance with the calculated CGH pattern, that is to say that dark area regions in FIG. 2 correspond e.g. to regions of the multilayer structure 11a in which the structure layer 13 is situated, while the latter is absent in the bright regions in FIG. 2, so that the base layer 12 is uncovered there.

Radiation components 14 which pass through the structure layer 13 in addition to the base layer 12 consequently have a different effective light path length and/or absorption than radiation components 15 which are incident in regions of the multilayer structure 11a that are left free of the structure layer 13 and which only pass through the base layer 12, which, together with the lateral CGH spatial distribution of the regions of the structure layer 13, produces the desired diffractive phase structure and/or amplitude structure scattering effect. For the layer thickness of the structure layer 13 of this two-stage amplitude and/or phase structure, depending on the application, values of between approximately 3 nm and approximately 200 nm are suitable, inter alia depending on the radiation wavelength and the structure layer material.

Figure 4:
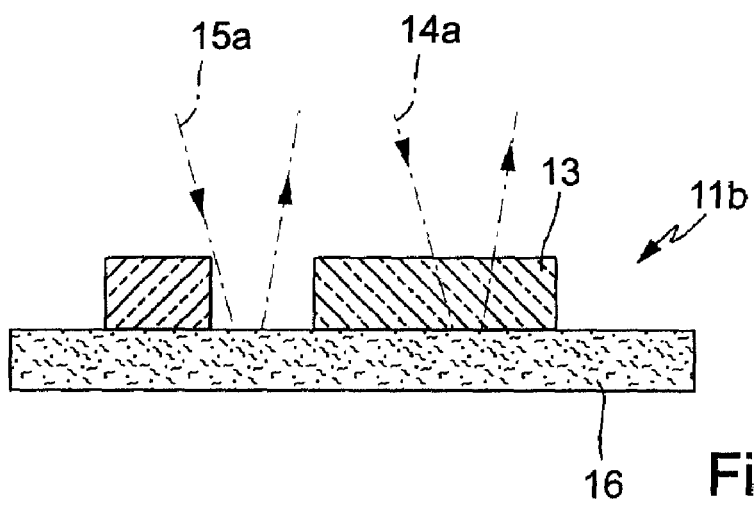
FIG. 4 shows a schematic cross-sectional view corresponding to FIG. 3, but for a reflecting realization of the scattering structure.

FIG. 4 shows a realization of the diffractive CGH scattering structure 11 of FIG. 2 as a reflecting multilayer structure 11b. This multilayer structure 11b comprises a reflecting base layer 16, e.g. a conventional reflecting MoSi multilayer layer on a carrier layer made e.g. of Zerodur material or some other conventional reflecting multilayer layer. A structure or membrane layer comprising the calculated CGH structure is once again applied to the base layer 16 and, in particular, as shown, may be the same transmitting structure layer 13 as in the exemplary embodiment of FIG. 3. Material selection and dimensioning of the structure layer 13 for providing the two-stage amplitude and/or phase structure are to be implemented in a manner corresponding to that for the exemplary embodiment of FIG. 3, so that reference may be made to the above explanations in this respect. As is illustrated in FIG. 4, for a given thickness of the structure layer 13, in reflection an amplitude or phase effect twice as great as in the case of transmission in accordance with FIG. 3 results since radiation components 14a that are incident and reflected in regions of the structure layer 13 traverse the latter twice, while radiation 15a incident in intermediate regions does not pass through the structure layer 13.

In a further variant, the diffractive CGH scattering structure may be formed by an absorbing multilayer structure, e.g. in accordance with the structure 11b of FIG. 4 with the modification that an absorbing structure layer is used instead of the transmitting structure layer 13.

Figure 5:
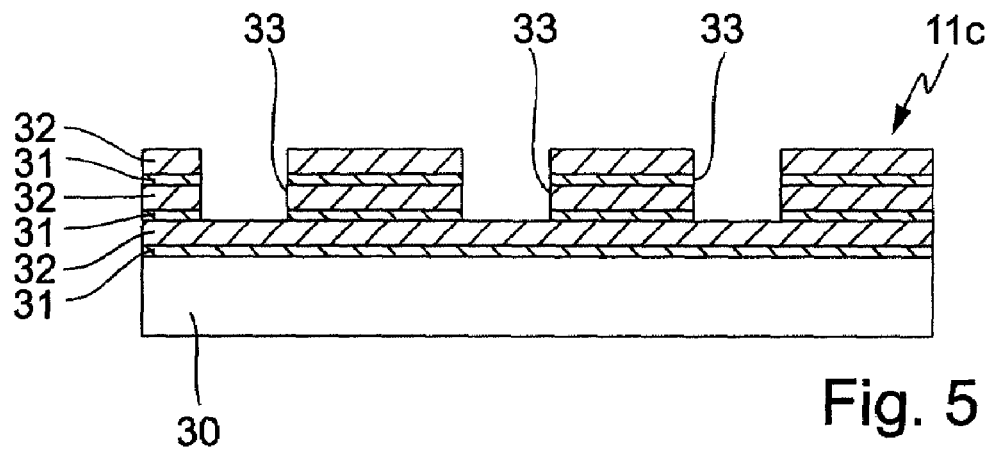
FIG. 5 shows a schematic cross-sectional view corresponding to FIG. 3, but for a multilayer structure with CGH structure depressions introduced for the realization of the scattering structure.

FIG. 5 shows a realization of the diffractive CGH scattering structure in the form of a multilayer structure 11c comprising, above a carrier layer 30, six layer elements made up respectively of a first layer element 31 and a second layer element 32 which are stacked one above the other alternately in repeated fashion twice. Depressions 33 are introduced into the four upper layer elements in accordance with the desired CGH pattern, e.g. by etching.

Figure 6:
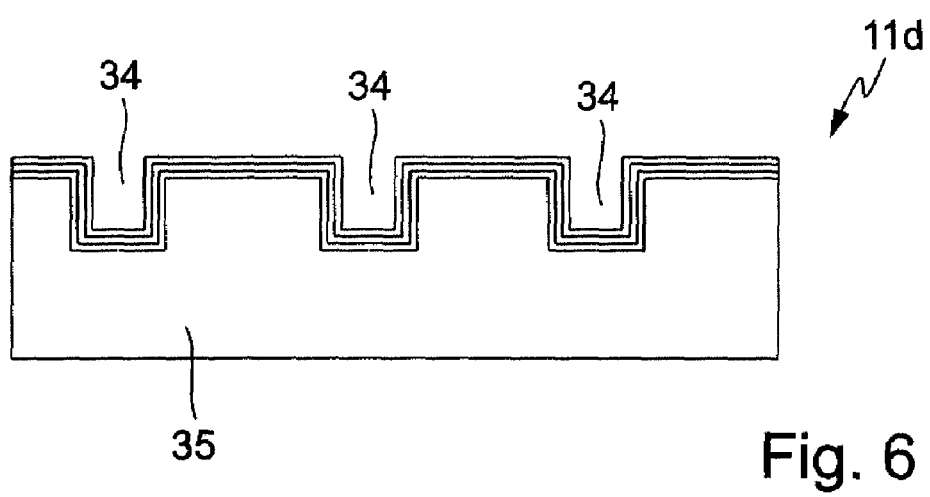
FIG. 6 shows a schematic cross-sectional view corresponding to FIG. 5, but for a multilayer structure with CGH structure depressions introduced into a base layer.

In a further variant shown in FIG. 6, the diffractive CGH scattering pattern is formed by a multilayer structure lid in which the desired CGH pattern is introduced as depressions 34 into a base layer 35 e.g. by etching. A plurality of layer elements 36, e.g. three, are then applied to the thus CGH-patterned top side of the base layer 35 in a whole-area and conformal manner, that is to say with an overall thickness of the layer elements 36 that is significantly less than the depth of the CGH structure depressions 34.

Figure 7:
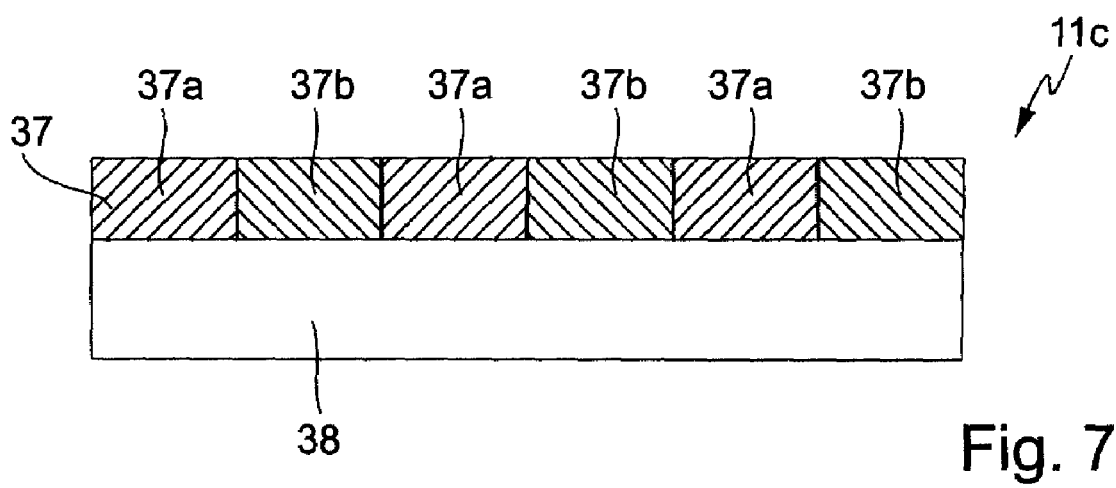
FIG. 7 shows a schematic side view corresponding to FIG. 3, but for a scattering structure realization by means of corresponding zones having different refractive indices of a structure layer.

FIG. 7 shows a realization of the diffractive CGH scattering structure in the form of a multilayer structure 11e comprising a refractive index variation layer 37 above a base layer 38. The refractive index variation layer 37 is applied to the base layer 38 over the whole area with a constant thickness, but is subdivided into two zones 37a, 37b having different refractive indices. In terms of their lateral extent, the two zones 37a, 37b have the configuration of the desired CGH pattern, that is to say that the diffractive CGH scattering structure is realized by the difference in refractive index in this exemplary embodiment. In the example of FIG. 7, there is in each case an abrupt transition from one refractive index to the other at the interfaces of the two zones 37a, 37b. In an alternative variant, a refractive index transition that is gradual in the lateral direction may be provided, that is to say that the refractive index undergoes transition from one value to the other continuously within a predeterminable lateral interface width. As explained above with regard to FIGS. 3 and 4, each of the multilayer structures according to the type of FIGS. 5 to 7 may be designed to operate in transmission or reflection, depending on the requirement. Furthermore, it goes without saying that any suitable combinations of the multilayer types explained above with regard to FIGS. 3 to 7 are possible for the production of the CGH scattering structure.

Whereas FIGS. 2 to 7 show examples of two-stage amplitude and/or phase structures, multilayer phase structures with three or more stages are also possible in alternative embodiments of the invention.

In an analogous manner, it is also possible, as is known, to realize diffractive focusing structures as a multilayer structure by forming a corresponding focusing pattern, e.g. a Fresnel zone pattern, in a transmitting or reflecting realization depending on the requirement.

Figure 8:
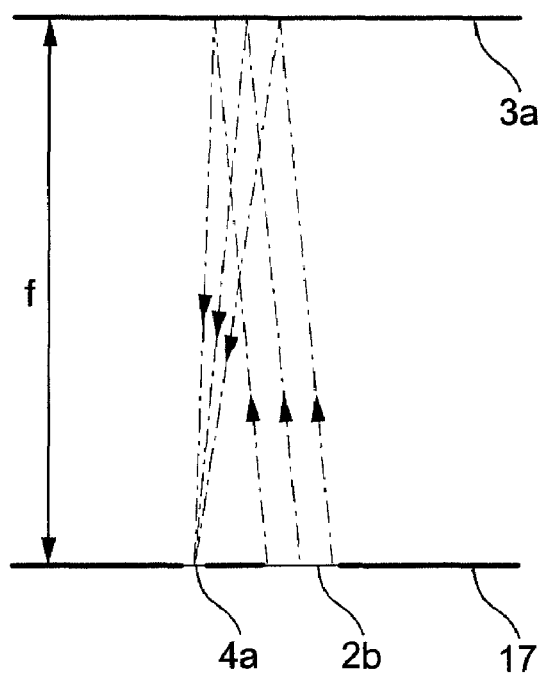
FIG. 8 shows a schematic side view of an alternative wavefront source to that of FIG. 1, with a reflecting focusing element and a combined scattering structure/wavefront formation structure substrate.

In this respect, FIG. 8 shows an application example in the form of a wavefront source comprising a focusing element 3a, which operates in reflection and which is formed by such a multilayer construction with a diffractive focusing structure, such as a Fresnel zone plate structure. For this purpose, analogously to the exemplary embodiment of FIG. 4, a corresponding Fresnel zone structure may be applied to a reflecting multilayer base layer, in which case, for use in the EUV wavelength range, it is once again possible in particular to use the layer materials mentioned above with regard to FIGS. 3 and 4.

Furthermore, in the case of the wavefront source of FIG. 8, the scattering and wavefront formation functions are integrated in a common substrate 17. For this purpose, the substrate 17 comprises, lying somewhat at a distance next to one another, firstly a scattering structure 2b and secondly a wavefront formation structure 4a. The scattering structure 2b is a diffractive CGH scattering structure e.g. of the type explained with regard to FIG. 2, or alternatively a conventional diffractive scattering structure, such as a ground-glass screen. The wavefront formation structure 4a corresponds to the coherence mask or object structure that is to be chosen in a manner dependent on the application, as explained above with regard to the coherence mask 4 of FIG. 1, e.g. for measurement by shearing interferometry or the Shack-Hartmann method.

In the case of the wavefront source of FIG. 8, the incoming radiation is directed on to the scattering structure 2b and subsequently focused by the reflecting diffractive focusing or lens element 3a on to the wavefront formation structure 4a, which then emits the desired wavefront radiation. In this case, the wavefront source of FIG. 8 preferably also has a $2f$ construction in which the scattering structure 2b lies in front of the focusing element 3a by approximately the focal length distance f, but preferably not exactly at the distance f, in the radiation path and the wavefront formation structure 4a lies behind the focusing element 3a by approximately the focal length distance f in the radiation path, thus resulting in the $2f$ imaging behavior.

Figure 9:
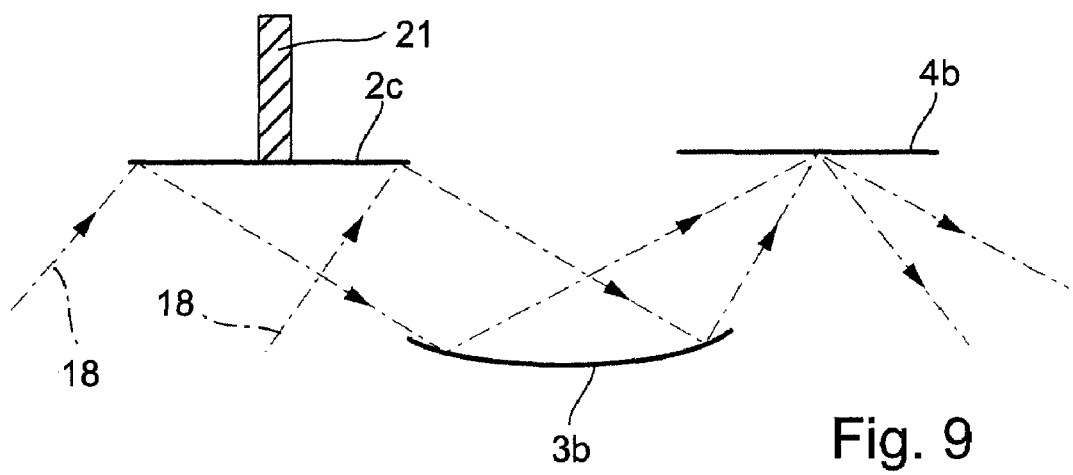
FIG. 9 shows a schematic side view of a further alternative wavefront source with a reflecting scattering structure, reflecting focusing element and reflecting wavefront formation structure.

FIG. 9 shows a further wavefront source with a $2f$ imaging behavior, in which all three functionally essential components are designed in reflecting fashion. Incident radiation (18) impinges on a diffuser 2c with a reflecting scattering structure, which may be a diffractive CGH scattering structure or any other conventional scattering structure, and is reflected by the latter on to a focusing element realized as a focusing mirror 3b. By way of example, a customary convex mirror or Fresnel zone mirror may be involved in this case. As an alternative, it is possible to use a diffractive reflecting focusing structure, like the reflecting multilayer focusing structure 3a of FIG. 8. The focusing element 3b reflects the radiation in focusing fashion on to a reflecting mask 4b with the wavefront formation structure required for shaping the desired wavefront radiation.

The diffuser 2c is optionally arranged in movable fashion, in one or more of its six degrees of freedom of movement depending on the requirement. For this optional case, the diffuser 2c, as illustrated schematically in FIG. 9, is held on an axial piece 21 in a displacement-movable manner and/or in a rotationally movable manner correspondingly in one, two or three spatial directions. A movement of the diffuser 2c is advantageous particularly during a measurement operation in which an objective of a projection exposure apparatus or some other optical imaging system is measured with regard to imaging errors by means of a wavefront sensor equipped with the wavefront source. The movement of the diffuser 2c contributes to an increase in the spatial incoherence of the radiation, as is desired for corresponding measuring techniques.

In further alternative embodiments (not shown) of the wavefront source according to the invention, the scattering function and the focusing function are integrated into a common scattering and focusing element. For this purpose, by way of example, a diffractive CGH scattering structure or some other conventional scattering structure and a focusing structure, e.g. a Fresnel zone plate structure, are provided such that they operate in reflection or transmission, depending on the requirement, on a common substrate, e.g. a multilayer substrate constructed from materials suitable for EUV. In further alternative embodiments of the invention, the scattering structure is situated in front of the focusing element at a distance of less than the focal length distance f in the light path.

Figure 10:
FIG. 10 shows a schematic side view of a further alternative wavefront source with a combined scattering structure/wavefront formation structure substrate without a focusing element.

Furthermore, the invention also encompasses embodiments of wavefront sources only with a scattering structure and wavefront formation structure, that is to say without a focusing structure. FIG. 10 shows such an exemplary embodiment, in which the scattering function and the wavefront formation function are integrated in a common, combined scattering and wavefront formation element 19. For this purpose, this combined element 19 may be formed e.g. by a multilayer construction made of materials suitable for EUV which contains a diffractive CGH scattering structure and a wavefront formation structure in combined fashion. Radiation 20 impinging at a specific angle at obliquely on the combined element 19 is homogenized in a desired manner by the latter through scattering in terms of its intensity and angular distribution and is shaped into the required wavefront radiation. In alternative embodiments, scattering function and wavefront formation function are separated by virtue of a diffractive CGH scattering structure without a focusing element being situated in the beam path in front of a wavefront formation structure.

As is made clear by the exemplary embodiments explained above, the invention provides a wavefront source which is suitable for wavefront sensors especially also for EUV interferometry or the Shack-Hartmann method for wavefront measurement of high-resolution projection objectives in microlithography projection exposure apparatuses and, moreover, for any other wavefront measurement applications in order to provide a homogenous and fully illuminating wavefront radiation together with beam amplification at the same time. It is advantageous to use a diffractive CGH scattering structure for producing a defined, e.g. two-dimensional Gaussian angular spectrum. Such a scattering structure can be realized in transmission and reflection and also as an amplitude or phase structure or combined amplitude and phase structure, precisely also for use in the EUV wavelength range.

Especially in an application for Shack-Hartmann measurement or interferometric measurement of projection objectives in microlithography projection exposure apparatuses, it is possible with the wavefront source according to the invention, also in the EUV wavelength range, for the pupil or the field of the objective to be illuminated completely and very homogeneously even if an upstream illumination system is used which has a pupil parceling effect and by itself is not able to illuminate the entire numerical aperture of the objective.

As is known per se as such for wavefront sources, the wavefront source according to the invention may be realized in single-channel or multichannel embodiment, depending on the requirement. In the latter case, a plurality, preferably a large number, of beam-guiding channels of identical type are arranged next to one another in the wavefront source.

Microlithography projection exposure apparatuses are customary in particular as so-called steppers or scanners. In order to measure e.g. the projection objective thereof with high accuracy, a wavefront sensor according to the invention, comprising the wavefront source according to the invention, may be realized as an independent measuring device in which the projection objective is measured prior to incorporation into the stepper or scanner. As an alternative, the wavefront sensor may be integrated in the stepper or scanner. In this case, the wavefront source according to the invention may e.g. be mounted as a complete component onto a carrier which can be loaded into the stepper or scanner instead of a reticle used in normal exposure operation, in the reticle plane. As an alternative, one or a plurality of channels of the wavefront source may be a fixed constituent part of the stepper or scanner by virtue of the wavefront source e.g. forming a fixed constituent part of a reticle displacement unit of the projection exposure unit of the stepper or scanner.

The above description of the preferred embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

What is claimed is:

1. A diffuser for a wavefront source of a wavefront sensor, comprising a diffractive computer-generated hologram (CGH) scattering structure with a predetermined angular scattering profile, and means for movably supporting the diffractive CGH scattering structure in at least one of at least one translation direction and at least one rotation direction, wherein the means for movably supporting the diffractive CGH scattering structure are configured to initiate movement of the diffractive CGH scattering structure during a measurement to increase spatial incoherence of radiation incident on the diffuser.

2. The diffuser as claimed in claim 1, wherein the diffractive CGH scattering structure has a two-dimensional, essentially Gaussian angular scattering profile.

3. The diffuser as claimed in claim 1, wherein the diffractive CGH scattering structure is formed by a transmitting, reflecting or absorbing multilayer structure which varies in accordance with a CGH pattern in terms of at least one of its effective layer thickness and its refractive index.

4. The diffuser as claimed in claim 3, wherein the at least one structure layer has minimum structure dimensions perpendicular to the light direction in the range between 30 nm and 3000 nm or in the light direction between approximately 3 nm and approximately 200 nm.

5. The diffuser as claimed in claim 4, wherein the at least one structure layer has minimum structure dimensions perpendicular to the light direction in the range between 100 nm to 200 nm.

6. The diffuser as claimed in claim 4, wherein the at least one structure layer has minimum structure dimensions perpendicular to the light direction in the range between 30 nm and 3000 nm and in the light direction between approximately 3 nm and approximately 200 nm.

7. A wavefront source for a wavefront sensor, comprising a wavefront formation structure and a diffuser with a scattering structure in the beam path in front of or at the level of the wavefront formation structure, wherein the diffuser comprises a diffractive computer generated hologram (CGH) scattering structure with a predetermined angular scattering profile.

8. The wavefront source as claimed in claim 7, further comprising a focusing element provided in the beam path in front of the wavefront formation structure and wherein the focusing element is at the level of the diffractive CGH scattering structure, or in front of or behind the diffractive CGH scattering structure.

9. The wavefront source as claimed in claim 8, wherein the focusing element is at the level of the diffractive CGH scattering structure, or directly in front of or directly behind the diffractive CGH scattering structure.

10. The wavefront source as claimed in claim 7, wherein the scattering structure and the wavefront formation structure are formed next to one another on a common substrate.

11. A wavefront sensor with a wavefront source for the measurement of objectives for projection exposure apparatus, wherein the wavefront source is as claimed in claim 7.

12. The wavefront source as claimed in claim 7, further comprising means for movably supporting the diffractive CGH scattering structure in at least one of at least one translation direction and at least one rotation direction, wherein the means for movably supporting the diffractive CGH scattering structure are configured to initiate movement of the diffractive CGH scattering structure during a measurement to increase spatial incoherence of radiation incident on the diffuser.

13. A wavefront source for a wavefront sensor, comprising
 a wavefront formation structure,
 a diffuser with a scattering structure in the beam path in front of the wavefront formation structure, and
 a focusing element with a reflecting focusing structure in the beam path in front of the wavefront formation structure; and
 wherein the focusing element is at the level of the scattering structure, or in front of or behind the scattering structure.

14. The wavefront source as claimed in claim 13, wherein the scattering structure and the wavefront formation structure are formed next to one another on a common substrate.

15. A wavefront sensor with a wavefront source for the measurement of objectives for projection exposure apparatus,
 wherein the wavefront source is as claimed in claim 14.

16. A projection exposure apparatus, comprising at least one objective and having a wavefront sensor as claimed in claim 15 for the measurement of the objective.

17. The projection exposure apparatus as claimed in claim 16, further comprising a reticle displacement unit comprising the wavefront source of the wavefront sensor as a fixed constituent part.

18. The projection exposure apparatus as claimed in claim 16, further comprising a carrier, on which the wavefront source is arranged and which is configured to be loaded into a reticle plane of the projection exposure apparatus.

19. The wavefront source as claimed in claim 13, further comprising means for movably supporting the scattering structure in at least one of at least one translation direction and at least one rotation direction,
 wherein the means for movably supporting the scattering structure are configured to initiate movement of the scattering structure during a measurement to increase spatial incoherence of radiation incident on the diffuser.

20. The wavefront source as claimed in claim 13, wherein the focusing element is at the level of the scattering structure, or directly in front of or directly behind the scattering structure.

21. A wavefront source for a wavefront sensor, comprising:
 a wavefront formation structure,
 a scattering structure in the beam path in front of the wavefront formation structure, and
 a focusing element with a reflecting focusing structure in the beam path in front of the wavefront formation structure.

22. The wavefront source as claimed in claim 21, further comprising means for movably supporting the scattering structure in at least one of at least one translation direction and at least one rotation direction,
 wherein the means for movably supporting the scattering structure are configured to initiate movement of the scattering structure during a measurement to increase spatial incoherence of radiation incident on the scattering structure.

23. The wavefront source as claimed in claim 21, wherein the focusing element with a reflecting focusing structure is in the beam path directly in front of the wavefront formation structure.

24. A wavefront source for a wavefront sensor, comprising:
 a wavefront formation structure, and
 a diffractive computer generated hologram (CGH) scattering structure with a predetermined angular scattering profile arranged in the beam path in front of or at a level of the wavefront formation structure.

25. The wavefront source as claimed in claim 24, further comprising means for movably supporting the scattering structure in at least one of at least one translation direction and at least one rotation direction,
 wherein the means for movably supporting the scattering structure are configured to initiate movement of the scattering structure during a measurement to increase spatial incoherence of radiation incident on the scattering structure.

* * * * *